(12) United States Patent
Chen et al.

(10) Patent No.: US 7,834,351 B2
(45) Date of Patent: *Nov. 16, 2010

(54) SEMICONDUCTOR DEVICE

(75) Inventors: Hsien-Wei Chen, Tainan County (TW); Shih-Hsun Hsu, Keelung (TW); Hsueh-Chung Chen, Taipei County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 12/426,995

(22) Filed: Apr. 21, 2009

(65) Prior Publication Data
US 2009/0200549 A1 Aug. 13, 2009

Related U.S. Application Data

(62) Division of application No. 11/754,394, filed on May 29, 2007, now Pat. No. 7,538,346.

(51) Int. Cl.
*H01L 23/58* (2006.01)
(52) U.S. Cl. .................... 257/48; 257/127; 257/170; 257/409; 257/484
(58) Field of Classification Search .................... 257/48, 257/127, 170, 409, 484
See application file for complete search history.

(56) References Cited

U.S. PATENT DOCUMENTS

| 6,300,223 | B1 | 10/2001 | Chang et al. | |
|---|---|---|---|---|
| 6,441,465 | B2 | 8/2002 | Lin et al. | |
| 6,753,608 | B2 | 6/2004 | Tomita | |
| 6,861,754 | B2 | 3/2005 | Lin et al. | |
| 7,397,103 | B2* | 7/2008 | Archer et al. | 257/484 |
| 7,538,346 | B2* | 5/2009 | Chen et al. | 257/48 |
| 2004/0084777 | A1* | 5/2004 | Yamanoue et al. | 257/758 |
| 2004/0150070 | A1* | 8/2004 | Okada et al. | 257/508 |
| 2006/0214798 | A1* | 9/2006 | Wang | 340/572.7 |
| 2008/0191205 | A1* | 8/2008 | Tsai et al. | 257/48 |
| 2008/0230873 | A1* | 9/2008 | Demircan et al. | 257/620 |

* cited by examiner

*Primary Examiner*—Victor A Mandala
(74) *Attorney, Agent, or Firm*—Thomas, Kayden, Horstemeyer & Risley

(57) ABSTRACT

A semiconductor device is disclosed. The device includes a substrate and a first wiring layer overlying the substrate. The first wiring layer comprises a first wiring area surrounded by a first seal ring. The first seal ring comprises a first monitor circuit isolated by a first dielectric layer embedded in the first seal ring. The first monitor circuit is responsive to a predetermined amount of deformation occurs in the third dielectric layer.

7 Claims, 11 Drawing Sheets

US 7,834,351 B2

SEMICONDUCTOR DEVICE

CROSS REFERENCE TO RELATED APPLICATIONS

This application is a division of U.S. patent application entitled "Semiconductor Device," Ser. No. 11/754,394, filed on May 29, 2007, the entirety of which are incorporated by reference herein.

BACKGROUND OF THE INVENTION

1. Field of the Invention

The invention relates to semiconductor technology and more particularly to devices capable of damage detection.

2. Description of the Related Art

FIG. 1 is a local top view of a semiconductor wafer comprising dice 10 separated by scribe lines 20 and 30. Each die 10 comprises a seal ring 11 around the outer periphery thereof to protect against moisture, mechanical damage, electrostatic damage, and other dangers. Floating metal blocks 21 and 31 are formed in the dielectric based scribe lines 20 and 30 for specific tasks, such as serving as an alignment mark.

In a die separation step, also known as die singulation, a diamond-blade dicing saw cuts the wafer along the scribe lines 20 and 30 and separates the wafer into individual dice 10. When the diamond blade contacts the harder and tougher metal blocks 21 and 31 during die separation, the diamond blade may vibrate and deviate, applying stress to the neighboring dice 10. Of course, the seal rings 11 are designed to protect the dice 10 from the stress. In semiconductor technology materials with a low dielectric constant (lower than 3), also known as low-k dielectrics, are introduced in wafer fabrication and utilized as inter-layer dielectrics. The mechanical strength of the low-k dielectrics is much lower than the conventional dielectric, silicon oxide, thus, stress from die separation tends to generate cracks in the inter-layer dielectrics passing through the seal rings 11, and extending into the interior of the dice 10.

Various technologies can effectively but not completely eliminate damage to low-k dielectrics. It is difficult to predict and observe the occurrence of the cracks in low-k dielectrics. Cracks in inner layers of low-k dielectrics are particularly difficult to identify because they are typically invisible during visual inspection.

Thus, a damage monitoring technology is desirable.

BRIEF SUMMARY OF THE INVENTION

The invention provides semiconductor devices providing damage monitoring for dielectric layers therein.

The invention further provides a semiconductor device comprising a substrate and a first wiring layer overlying the substrate. The first wiring layer comprises a first wiring area surrounded by a first seal ring. The first seal ring comprises a first monitor circuit isolated by a first dielectric layer embedded in the first seal ring. The first monitor circuit comprises a pair of first monitor pads and a pair of first connection elements. The first connection elements respectively extend from and are electrically connected between the first monitor pads are electrically connected. The first connection elements are isolated by the first dielectric layer. The first connection elements are disposed in close proximity and respectively extend from the first monitor pads.

The invention further provides a semiconductor device comprising a substrate and a first wiring layer overlying the substrate. The first wiring layer comprises a first wiring area surrounded by a first seal ring. The first seal ring comprises a first monitor circuit isolated by a first dielectric layer embedded in the first seal ring. The first monitor circuit comprises a pair of first monitor pads and a pair of first connection elements. The first monitor pads are spaced apart and isolated by the first dielectric layer. The electrically connected first connection elements respectively extending from the first monitor pads are electrically connected. The connection between the first connection elements tends to break when a predetermined amount of deformation occurs in the first dielectric layer.

Further scope of the applicability of the invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
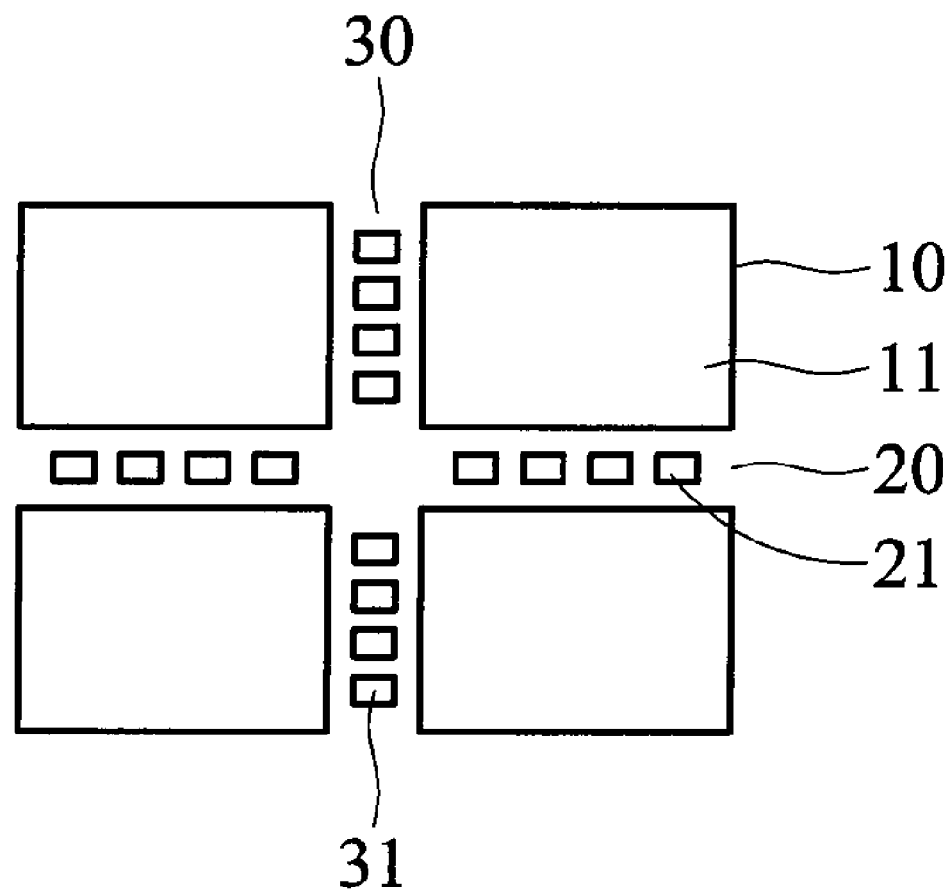
FIG. 1 is a local top view of a semiconductor wafer.
Figure 2A:
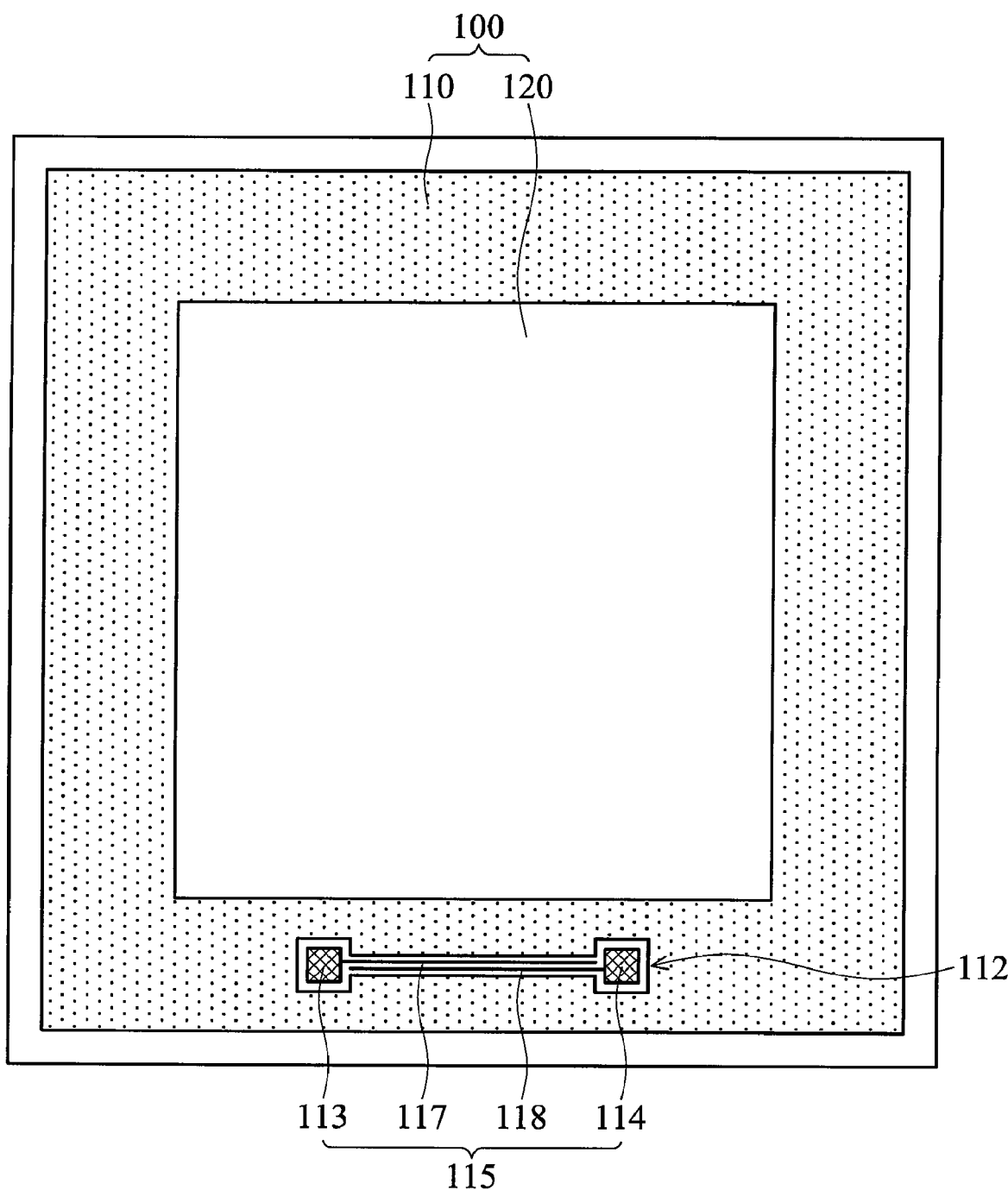
FIGS. 2A through 2D are top views of exemplary layouts of the inventive semiconductor device.
Figure 2B:
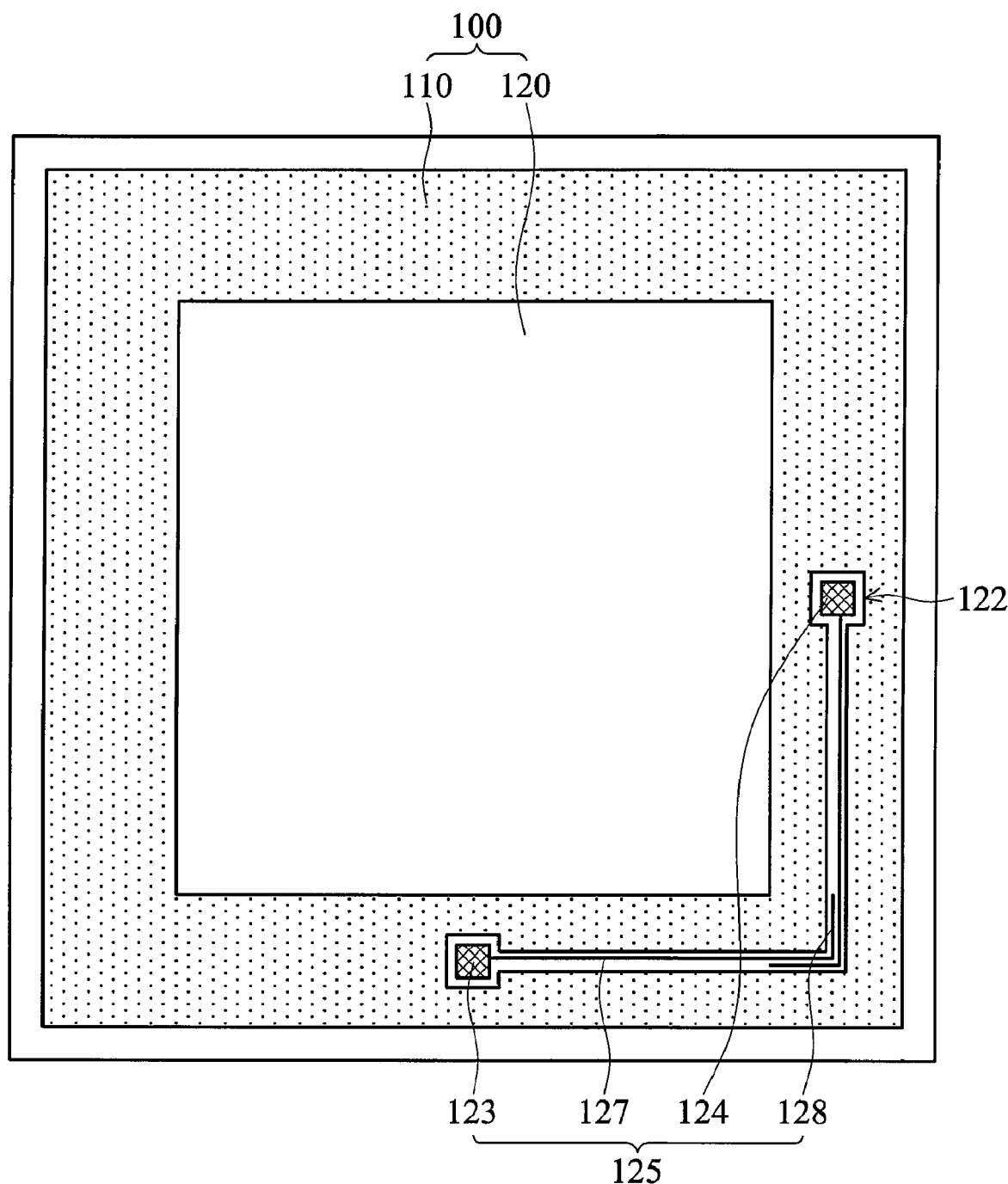
Figure 2C:
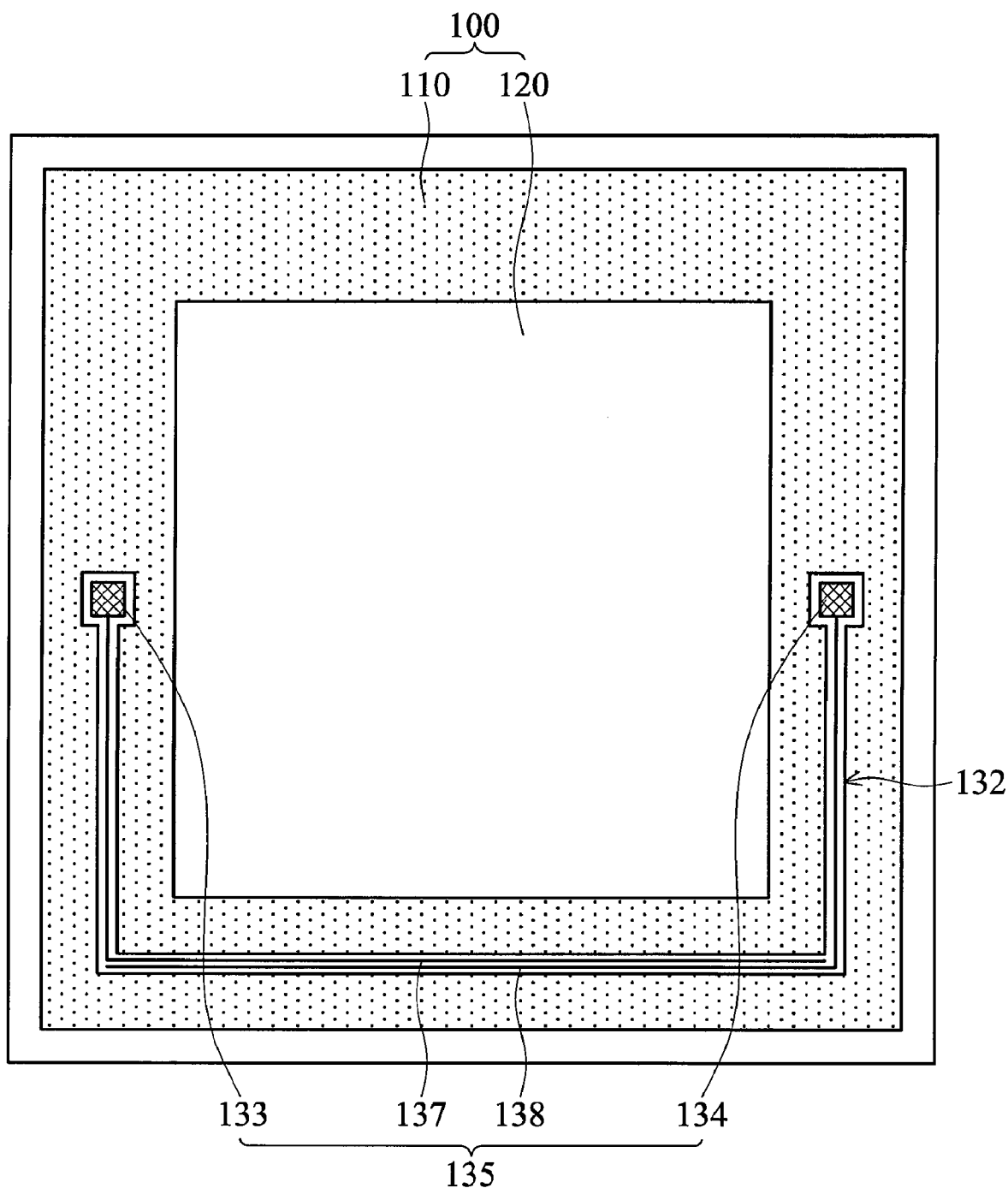

FIGS. 2A through 2C are top views of exemplary layouts of a wiring layer 100 overlying a substrate 1 (shown in FIGS. 4A and 4B) of the semiconductor device of the invention. The inventive semiconductor device may comprise one or more interconnection or metallization layers. In one embodiment, the wiring layer 100 is disposed at the bottom interconnection or metallization layer of the semiconductor device. In an alternative embodiment, the wiring layer 100 is disposed in the top interconnection layer of the semiconductor device. In another embodiment, the wiring layer 100 is disposed in the other interconnection or metallization layer of the semiconductor device. In some embodiments, the wiring layer 100 is disposed in all of interconnection layers of the semiconductor device. In some embodiments, the wiring layer 100 is disposed in any interconnection layer of the semiconductor device rather than the top interconnection layer, and the above interconnection layers including the top layer may comprise similar wiring layers stacked over the wiring layer 100.

In FIG. 2A, the wiring layer 100 comprises a wiring area 120 surrounded by a seal ring 110. The wiring area 120 comprises a wiring pattern (not shown) serving as trace lines electrically connecting the internal electronic elements (not shown) in substrate 1. The wiring pattern and the seal ring 110 are embedded in an inter-layer dielectric layer 150 (shown in FIG. 6). In this embodiment, the inter-layer dielectric layer 150 comprises low-k dielectrics. The inter-layer dielectric layers of the inventive semiconductor device are not shown in this and the subsequent top view drawings for clarity. The seal ring 110 preferably comprises metal providing sufficient strength for protecting the wiring structure in the wiring area from damage. In this embodiment, the seal ring 110 comprises copper.

The seal ring 110 comprises a monitor circuit 115 surrounded by a dielectric layer 112 embedded therein. The dielectric layer 112 electrically isolates the monitor circuit 115 from other parts of the seal ring 110. The dielectric layer 112 preferably has approximately the same strength, such as approximately the same Young's modulus, as that of the inter-layer dielectric layer 150, and thus, approximately the same deformation occurs in the dielectric layers 112 and 150 when stress from die separation or other factors is exerted. The dielectric layer 112 can provide the real deformation occurring in the inter-layer dielectric layer 150 for the monitor circuit 115. In this embodiment, the dielectric layers 112 and 150 are patterned from the same dielectrics formed overlying the substrate 1. The monitor circuit 115 may comprise metal or other conductive materials. In this embodiment, the monitor circuit 115 and the other parts of the seal ring 110 are formed by the same copper layer.

Figure 3A:
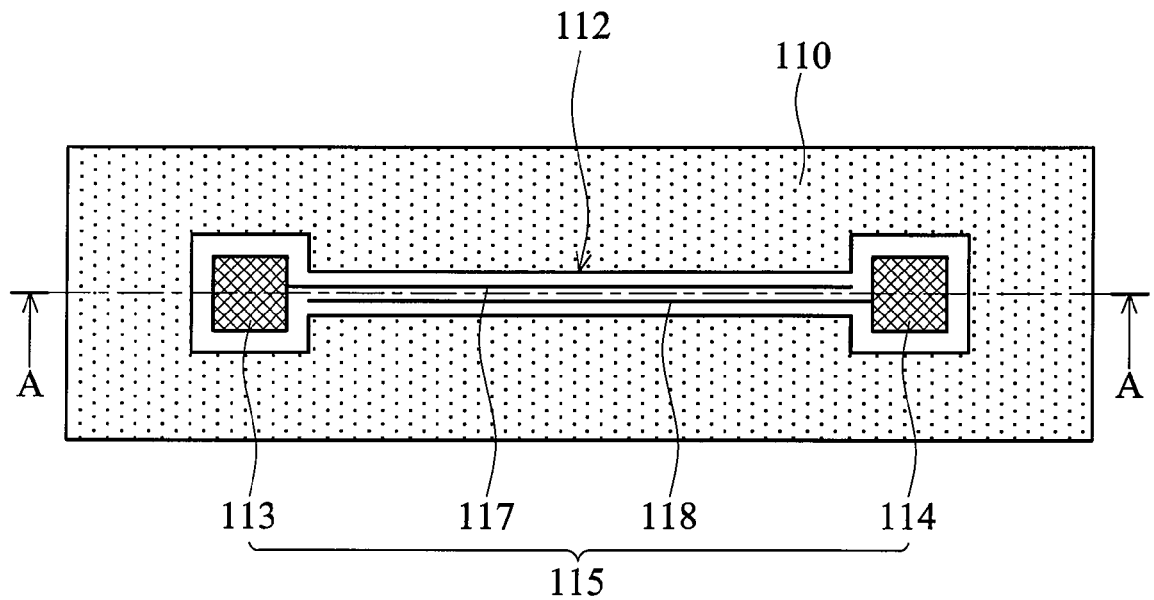
FIGS. 3A through 3C are enlarged top views of preferred embodiments of the inventive semiconductor device.

The monitor circuit 115 comprises a pair of monitor pads 113 and 114 and a pair of connection elements 117 and 118, and an enlarged top view thereof is shown in FIG. 3A. The connection element 117 extends from the monitor pad 113, and the connection element 118 extends from the monitor pad 114. The connection elements 117 and 118 are disposed in close proximity. In this embodiment, the connection elements 117 and 118 are in close proximity and disposed between the monitor pads 113 and 114. In other embodiments, the connection elements 117 and 118 may be disposed in close proximity in any appropriate areas of the dielectric layer 112. The dielectric layer 112 and the inter-layer dielectric layer 150 deform and cracking occurs therein when stress is exerted. In this embodiment, the monitor circuit 115 is originally open. When cracking and a predetermined amount of deformation occur in the dielectric layer 112, the connection elements 117 may contact connection elements 118, causing the monitor circuit 115 to short, damaging the inter-layer dielectric layer 150. An apparatus or operator can detect the short of the monitor circuit 115 utilizing a simple test such as an open-short test, thus, visual inspection for damage in the inter-layer dielectric layer 150 is no longer required.

Figure 2D:
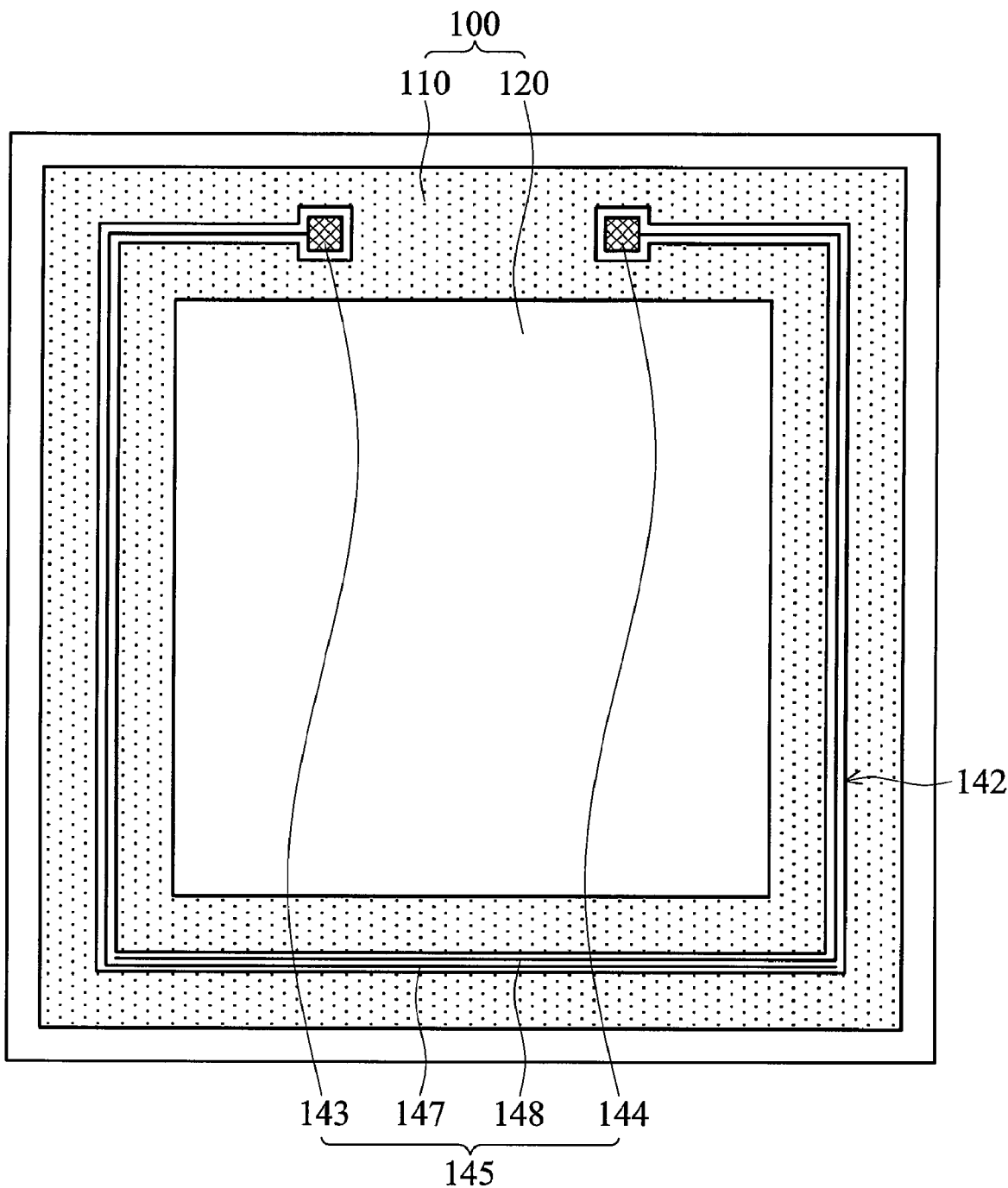

In FIG. 2A, the monitor circuit 115 is disposed at one side of the seal ring 110, and exemplary modifications for the monitor circuit 115 are shown in FIGS. 2B through 2D.

In FIG. 2B, the seal ring 110 comprises a monitor circuit 125 isolated by a dielectric layer 122 embedded in the seal ring 110, instead of the monitor circuit 115 and the dielectric layer 112 shown in FIG. 2A. The monitor circuit 125 comprises a pair of monitor pads 123 and 124 and a pair of connection elements 127 and 128. The monitor pads 123 and 124 are disposed in two neighboring sides of the seal ring 110. The dielectric layer 122, the monitor pads 123 and 124, and the connection elements 127 and 128 are similar to the dielectric layer 112, the monitor pads 113 and 114, and the connection elements 117 and 118, and thus, further description thereof is omitted.

In FIG. 2C, the seal ring 110 comprises a monitor circuit 135 isolated by a dielectric layer 132 embedded in the seal ring 110, instead of the monitor circuit 115 and the dielectric layer 112 shown in FIG. 2A. The monitor circuit 135 comprises a pair of monitor pads 133 and 134 and a pair of connection elements 137 and 138. The monitor pads 133 and 134 are disposed in two opposite sides of the seal ring 110. The dielectric layer 132, the monitor pads 133 and 134, and the connection elements 137 and 138 are similar to the dielectric layer 112, the monitor pads 113 and 114, and the connection elements 117 and 118, thus further description thereof is omitted.

In FIG. 2D, the seal ring 110 comprises a monitor circuit 145 isolated by a dielectric layer 142 embedded in the seal ring 110, instead of the monitor circuit 115 and the dielectric layer 112 shown in FIG. 2A. The monitor circuit 145 comprises a pair of monitor pads 143 and 144 and a pair of connection elements 147 and 148. The monitor pads 143 and 144 are disposed in the same side of the seal ring 110. The connection element 147 extends counterclockwise, from the monitor pad 143. The connection element 148 extends clockwise, from the monitor pad 144. The connection elements 147 and 148 are in disposed close proximity opposite to the monitor pads 143 and 144. The dielectric layer 142, the monitor pads 143, and 144, and the connection elements 147, and 148 are similar with the dielectric layer 112, the monitor pads 113, and 114, and the connection elements 117, and 118, thus, further description is omitted.

Figure 3B:
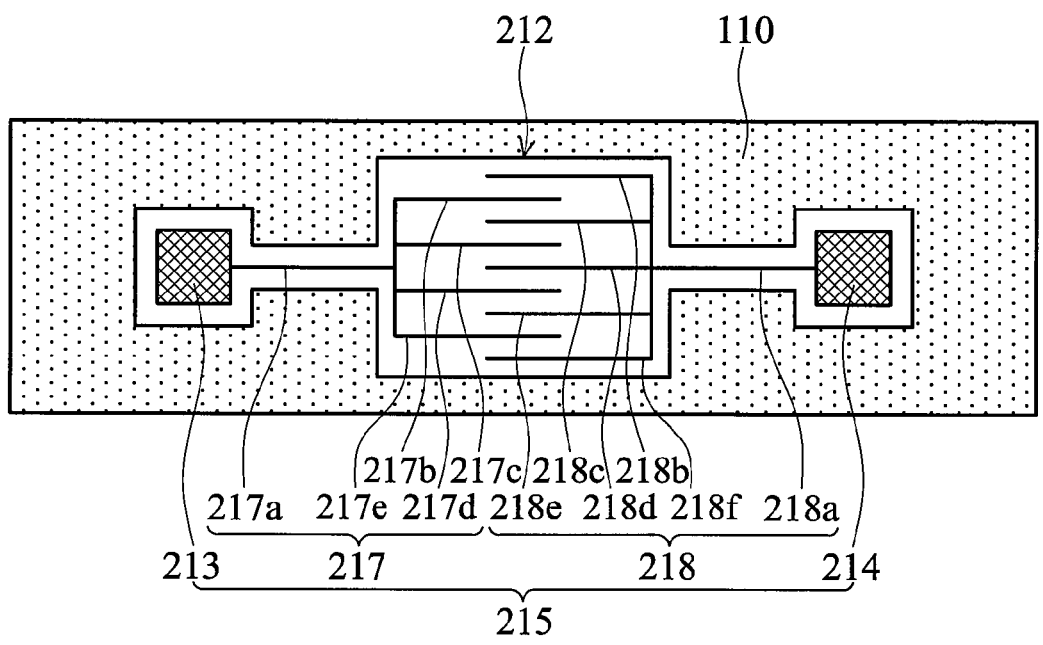
Figure 3C:
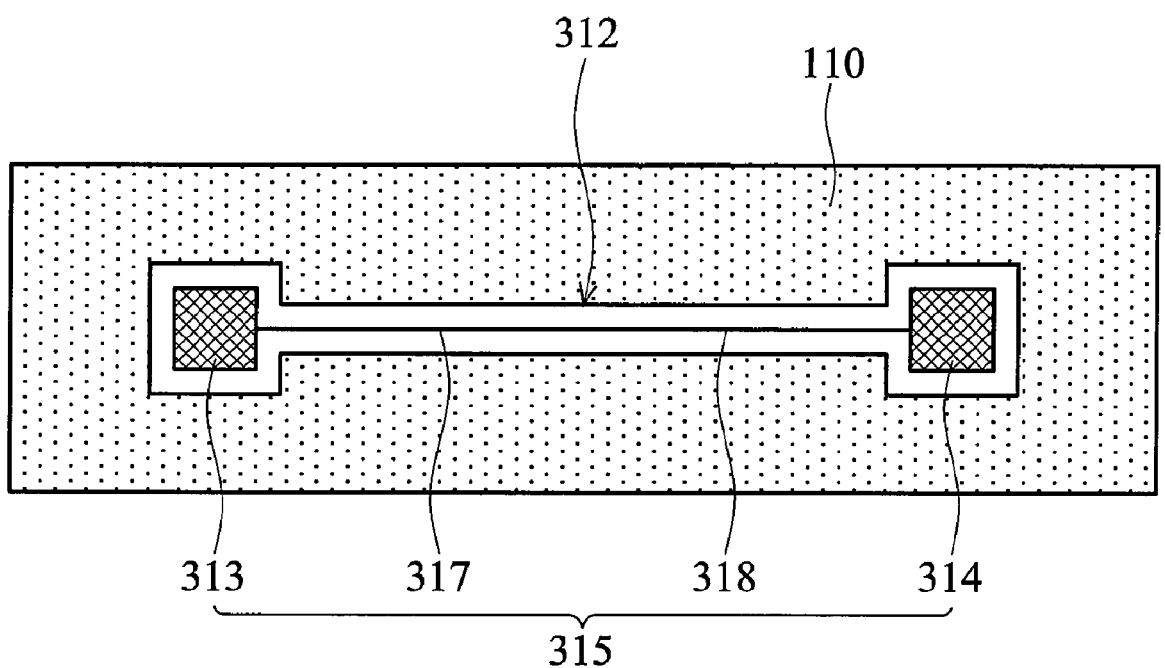

FIG. 3A shows an enlarged top view of the monitor circuit 115 shown in FIG. 2A. FIGS. 3B through 3D show modifications for connection elements 117 and 118 in FIG. 3A.

In FIG. 3B, the seal ring 110 comprises a monitor circuit 215 isolated by a dielectric layer 212 embedded in the seal ring 110, instead of the monitor circuit 115 and the dielectric layer 112 shown in FIG. 3A. The monitor circuit 215 comprises a pair of monitor pads 213 and 214 and a pair of connection elements 217 and 218. The monitor pads 213 and 214 are disposed as the monitor pads 113 and 114 in FIG. 3A. The connection element 217 comprises a main trace line 217a extending from the monitor pad 213 and branching into a comb shape toward the monitor pad 214. The comb-shaped connection element 217 comprises comb teeth 217b through 217e extending from the main trace line 217a. The connection element 218 comprises a main trace line 218a extending from the monitor pad 214 and branching into a comb shape toward the monitor pad 213. The comb-shaped connection element 218 comprises comb teeth 218b through 218f extending from the main trace line 218a. The comb teeth 217b through 217e are interdigitated in close proximity with the comb teeth 218b through 218f. The dielectric layer 212 and the inter-layer dielectric layer 150 deform and cracking occurs therein when stress is exerted. In this embodiment, the monitor circuit 215 is originally open. When cracking and a predetermined amount of deformation occur in the dielectric layer 212, the comb teeth 217b through 217e and 218b through 218f of the connection elements 217 and 218 come in contact, causing the monitor circuit 215 to short, damaging the inter-layer dielectric layer 150. An apparatus or operator can detect the short of the monitor circuit 215 utilizing a simple test such as an open-short test, thus, visual inspection for the damage in the inter-layer dielectric layer 150 is no longer required. The dielectric layer 212, the monitor pads 213, 214, and the connection elements 217, 218 are similar with the dielectric layer 112, the monitor pads 113, 114, and the connection elements 117, 118, thus, further description is omitted.

In FIG. 3C, the seal ring 110 comprises a monitor circuit 315 isolated by a dielectric layer 312 embedded in the seal ring 110, instead of the monitor circuit 115 and the dielectric layer 112 shown in FIG. 3A. The monitor circuit 315 comprises a pair of monitor pads 313 and 314 and a pair of connection elements 317 and 318. The monitor pads 313 and 314 are disposed as the monitor pads 113 and 114 in FIG. 3A. The connection element 317 extends from the monitor pad 313, and the connection element 318 extends from the monitor pad 314. The connection elements 317 and 318 are electrically connected. The dielectric layer 312 and the inter-layer dielectric layer 150 deform and cracking occurs therein when stress is exerted. In this embodiment, the monitor circuit 315 is originally short. When cracking and a predetermined amount of deformation occur in the dielectric layer 312, the connection between the connection elements 317 and 318 tends to break, causing the monitor circuit 315 to open, damaging the inter-layer dielectric layer 150. An apparatus or operator can detect the open of the monitor circuit 315 utilizing a simple test such as an open-short test, thus, visual inspection for the damage in the inter-layer dielectric layer 150 is no longer required. The dielectric layer 312, the monitor pads 313, and 314, and the connection elements 317, and 318 are similar with the dielectric layer 112, the monitor pads 113, and 114, and the connection elements 117, and 118, thus, further description is omitted.

Figure 4A:
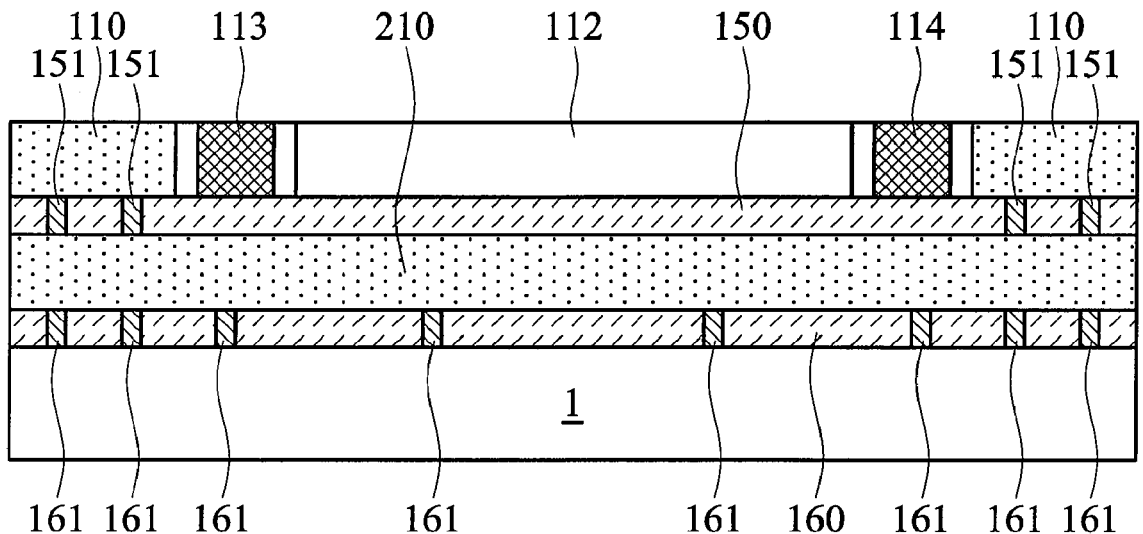
FIGS. 4A and 4B show exemplary cross sections along section line AA in FIG. 3A.
Figure 4B:
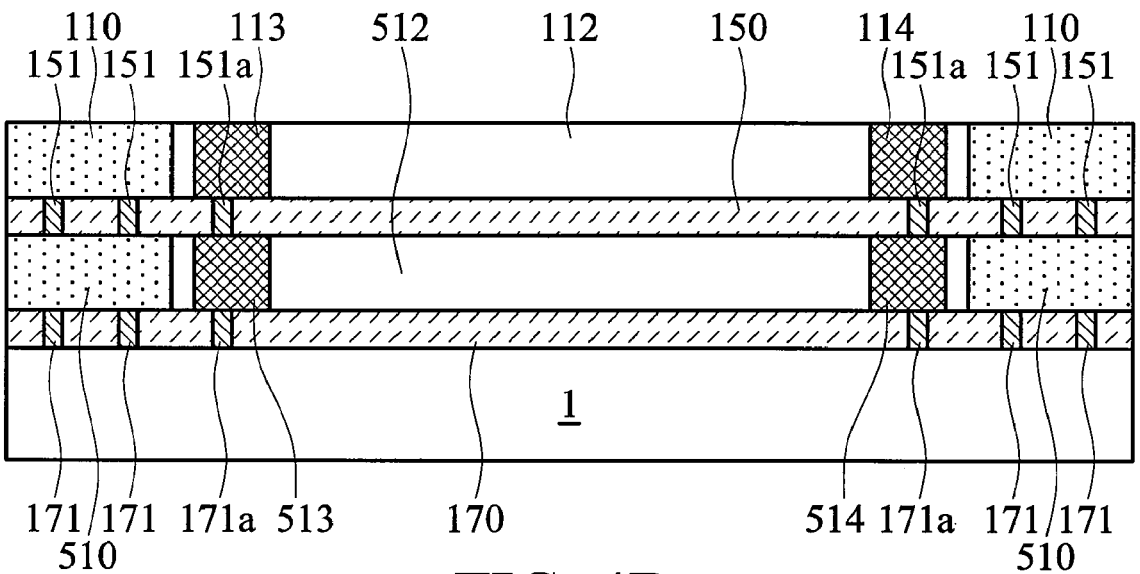

FIGS. 4A and 4B show exemplary cross sections along section line AA in FIG. 3A. In FIG. 4A, the inventive seal ring 110 is formed overlying a conventional seal ring 210. FIG. 4B shows a stacked structure of inventive seal rings 110 and 510.

In FIG. 4A, the wiring layers, comprising the seal rings 110 and 210, are disposed in different interconnection or metallization layers of the semiconductor device. The substrate 1 comprises a semiconductor layer or wafer with functional circuits and/or devices. In some embodiments, the substrate may further comprise other interconnection or metallization layers comprising conventional seal rings (not shown). The conventional seal ring 210 is embedded in an inter-layer dielectric layer 160 overlying the substrate 1, and connects the substrate 1 utilizing the via structures 161 through the inter-layer dielectric layer 160. The seal ring 110 is embedded in the inter-layer dielectric layer 150 overlying the seal ring 210 and the inter-layer dielectric layer 160. The seal ring 110 connects the underlying seal ring 210 utilizing via structures 151 through the inter-layer dielectric layer 150. In this embodiment, the monitor pads 113 and 114 are not connected to the seal ring 210 to prevent electrical connection therebetween through the seal ring 210, thus affecting the intended function of the inventive monitor circuit 115 and modifications. In other embodiments, the monitor pads 113 and 114 may be connected through the seal ring 210, but the connection cannot cause substantial electrical connection between the monitor pads 113 and 114.

In FIG. 4B, a wiring layer comprising a seal ring 510 replaces the wiring layer comprising the conventional seal ring 210 shown in FIG. 4A. The seal ring 510 comprises a monitor circuit isolated by a dielectric layer 512 embedded in the seal ring 510. The monitor circuit is similar to the described monitor circuit 115 or modifications thereof, and comprises a pair of monitor pads and a pair of connection elements, but only the monitor pads 513 and 514 are shown in FIG. 4B. The seal ring 510 is embedded in an inter-layer dielectric layer 170 overlying the substrate 1, and connects the substrate 1 utilizing via structures 171 through the inter-layer dielectric layer 170. In this embodiment, the monitor pads 513 and 514 connect the substrate 1 utilizing the via structures 171a through the inter-layer dielectric layer 170, but the connection does not cause substantial electrical connection between the monitor pads 513 and 514. In other embodiments, the monitoring pads 513 and 514 do not connect to the substrate 1. The seal ring 110 is embedded in the inter-layer dielectric layer 150 overlying the seal ring 510 and the inter-layer dielectric layer 170. The seal ring 110 connects the underlying seal ring 510 utilizing via structures 151 through the inter-layer dielectric layer 150. The monitor circuit 115 electrically connects the underlying monitor circuit utilizing via structures 151a electrically connecting the monitor pad 113 with the monitor pad 513, and the monitor pad 114 with the monitor pad 514.

When the wiring layer 100 shown in FIGS. 2A, 3A, and 4A is not disposed in the top interconnection or metallization layer of the semiconductor device, the stacking structures comprising the seal rings 110 and 510 shown in FIG. 4B may be repeated in the interconnection or metallization layers overlying the wiring layer 100 shown in FIG. 4A of the semiconductor device until the top interconnection or metallization layer is complete. When the wiring layer 100 shown in FIGS. 4A and 4B are disposed in the top interconnection or metallization layer, the monitor pads 113 and 114 are preferably electrically connected to the I/O pads for performing the described test of the monitor circuit 115 and modifications thereof. The exemplary connections are shown in FIGS. 5A and 5B.

Figure 5A:
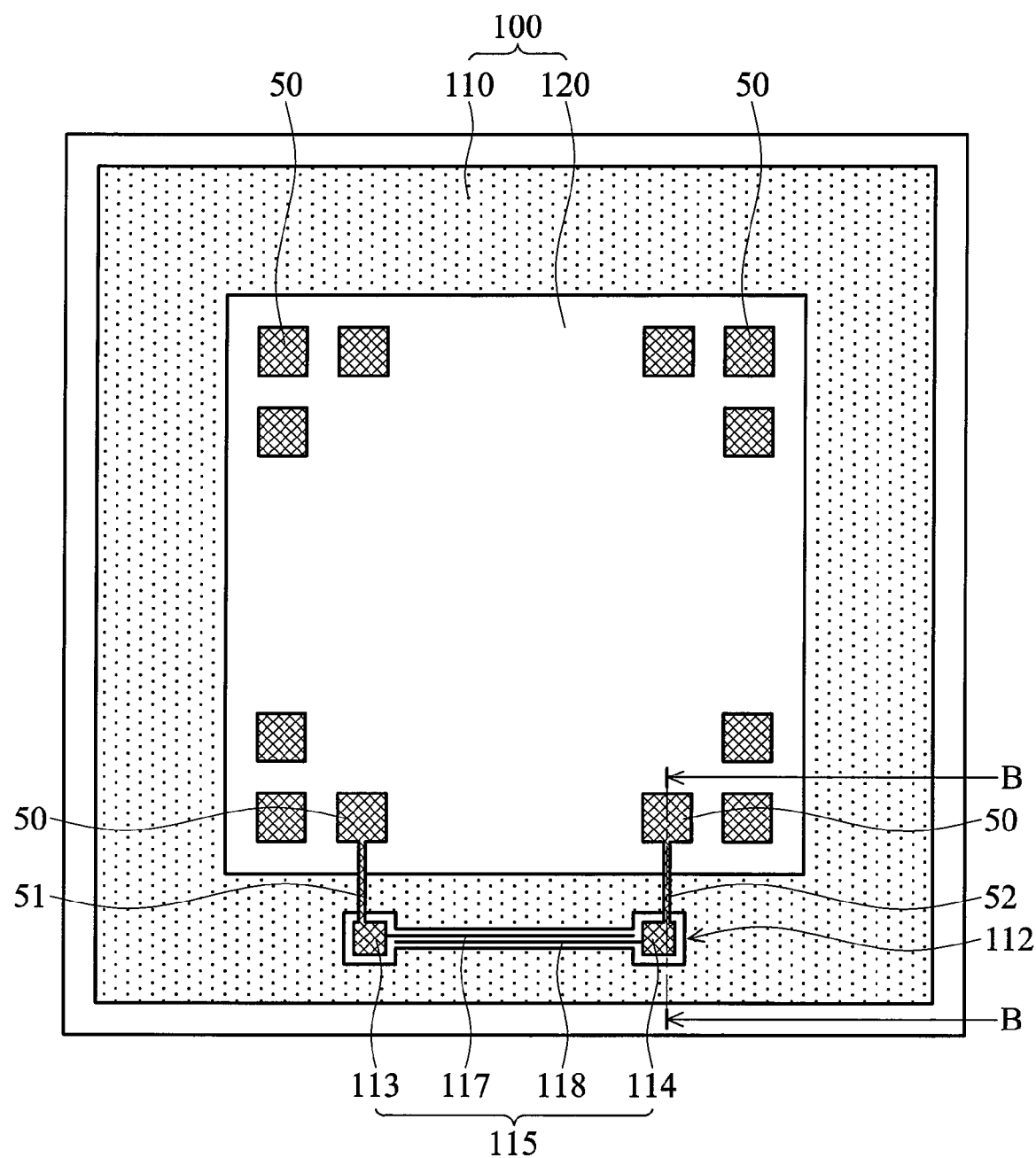
FIGS. 5A and 5B are top views of exemplary surface wirings for the semiconductor device shown in FIG. 2A.
Figure 5B:
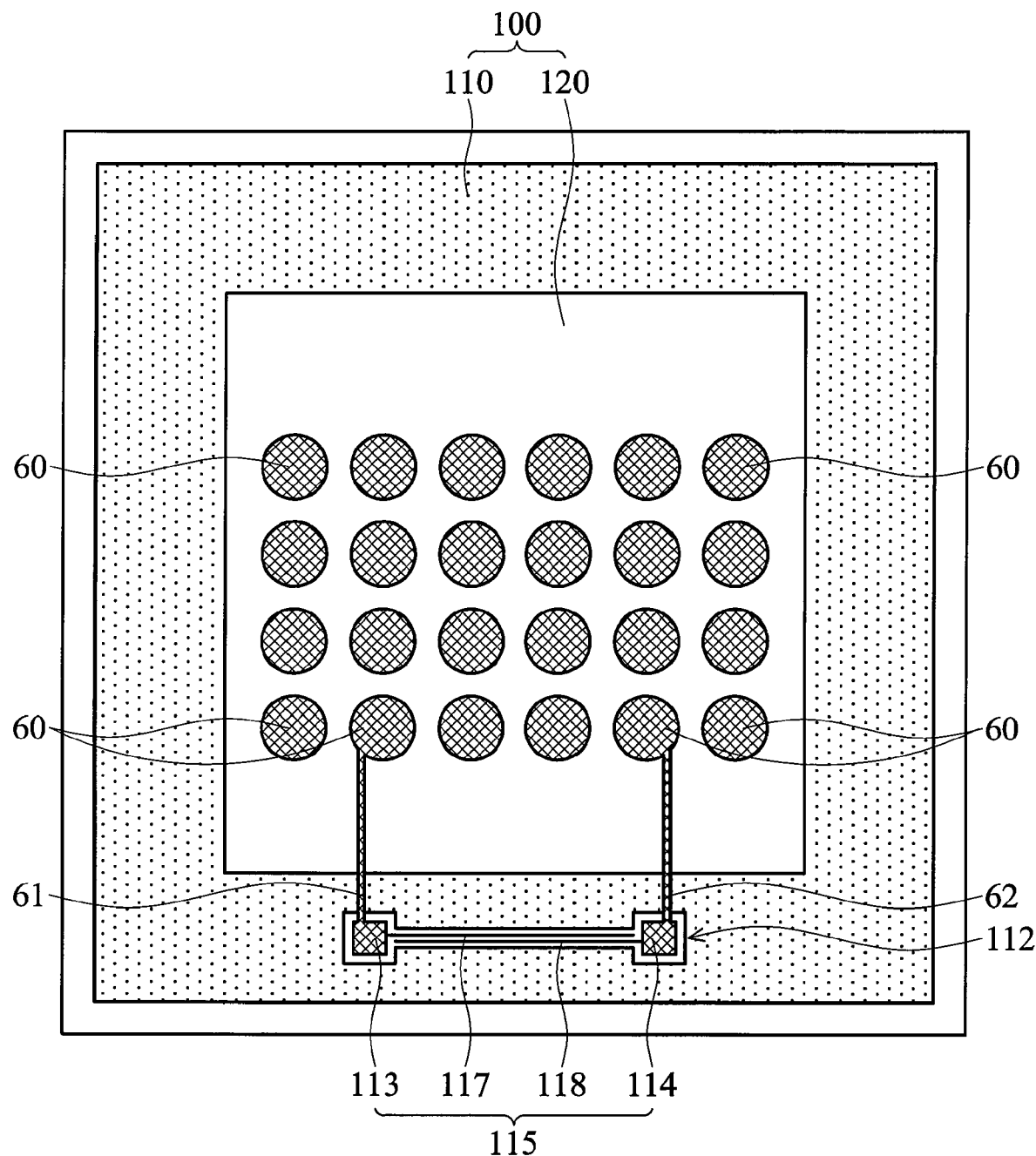

FIGS. 5A and 5B are top views of a surface wiring for connection to the monitor circuit 115 shown in FIG. 2A. In some embodiments, the monitor circuit 115 in FIGS. 5A and 5B may be replaced by modifications thereof.

Figure 6:
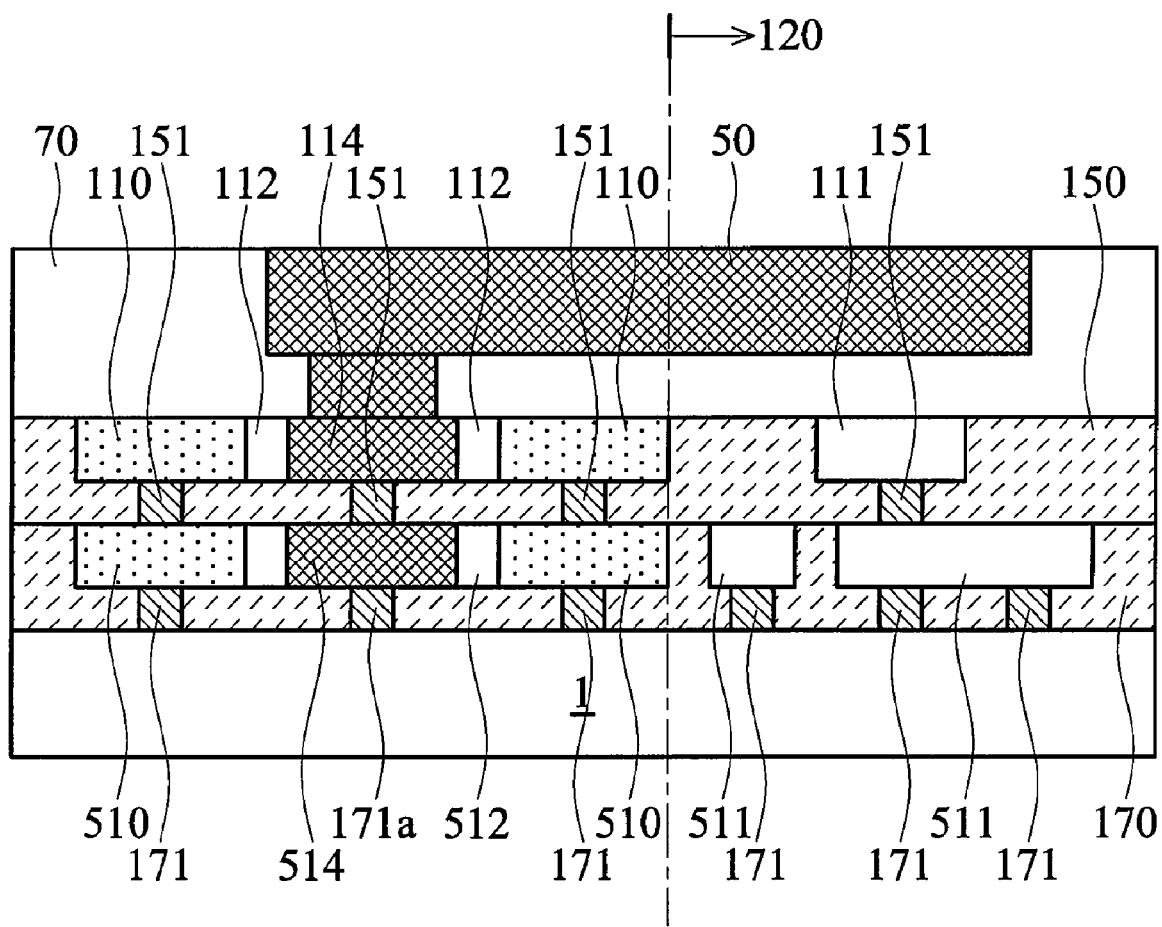
FIG. 6 shows an exemplary cross section along section line BB in FIG. 5A.

In FIG. 5A, the semiconductor device is designed for wire bonding package technology, and the depicted cross section is taken along section line BB of FIG. 6. A passivation layer 70 (shown in FIG. 6) is formed overlying the wiring layer 100 of the top interconnection or metallization layer of the semiconductor. The passivation layer 70 is then patterned to expose the monitor pads 113, 114 and the predetermined positions for bond pads in the wiring area 120, followed by deposition of a metal layer, such as aluminum or aluminum-copper alloy, to form a plurality of bond pads 50, a trace line 51 electrically connecting the monitor pad 113 and one of the bond pads 50, and a trace line 52 electrically connecting the monitor pad 114 and one of the other bond pads 50. Thus, the bond pads 50 connecting the trace lines 51 and 52 serve as I/O pads for open or short tests of the monitor circuit 115. For example, probe pins of a test apparatus can touch the bond pads for open or short tests of the monitor circuit 115.

In FIG. 5B, the semiconductor device is designed for flip chip package technology. The monitor pads 113 and 114 are electrically connected to two of the bump pads 60 in the wiring area 120 by steps similar to the described steps for connecting to bond pads in FIG. 5A, through trace lines 61 and 62, respectively. Thus, the bond pads 60, connecting the trace lines 61 and 62, serve as I/O pads for open or short tests of the monitor circuit 115. For example, probe pins of a test apparatus can touch the bond pads for open or short tests of the monitor circuit 115.

FIG. 6 is an exemplary cross section along section line BB in FIG. 5A based on the structure shown in FIG. 4B. The wiring layer 100 further comprises a trace line 111 in the wiring area 120, electrically connecting the underlying trace lines 511 of the underlying wiring layer through the via structure 151. The trace lines 511 electrically connect the substrate 1 through via structure 171.

The efficacy of the inventive semiconductor devices including inventive monitor circuits, provide the capability to detect the damage in the inter-layer dielectrics thereof without requiring conventional visual inspection.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a substrate; and
   a first wiring layer overlying the substrate, the first wiring layer comprising a first wiring area surrounded by a first seal ring comprising a first monitor circuit isolated by a first dielectric layer embedded in the first seal ring, wherein the first monitor circuit comprises:
   a pair of first monitor pads, isolated by the first dielectric layer, spaced apart from each other; and
   a pair of first connection elements respectively extending from the first monitor pads, which are electrically connected, wherein a connection between the first connection elements tends to break when a predetermined amount of deformation occurs in the first dielectric layer.

2. The device as claimed in claim 1, wherein the first wiring layer is the top wiring layer of the semiconductor device.

3. The device as claimed in claim 2, further comprising a plurality of connection pads embedded in a passivation layer overlying the first wiring layer, and two of the connection pads respectively electrically connecting to the first monitor pads utilizing trace lines.

4. The device as claimed in claim 2, further comprising a second wiring layer underlying the first wiring layer and electrically connecting to the first wiring layer, wherein the second wiring layer comprises a second wiring area surrounded by a second seal ring.

5. The device as claimed in claim 4, wherein the second seal ring comprises a second monitor circuit isolated by a second dielectric layer embedded in the second seal ring, and the second monitor circuit comprises:
   a pair of second monitor pads, isolated by the second dielectric layer, spaced apart from each other, wherein the second monitor pads respectively electrically connects the first monitor pads; and
   a pair of second connection elements electrically connected and respectively extending from the second monitor pads to , wherein the connection between the second connection elements tends to break when a predetermined amount of deformation occurs in the second dielectric layer.

6. The device as claimed in claim 4, further comprising a plurality of via structures connecting the second wiring layer to the substrate.

7. The device as claimed in claim 1, further comprising a plurality of via structures connecting the first wiring layer to the substrate.

* * * * *